US009379275B2

(12) United States Patent
Liao et al.

(10) Patent No.: US 9,379,275 B2
(45) Date of Patent: Jun. 28, 2016

(54) APPARATUS AND METHOD FOR REDUCING DARK CURRENT IN IMAGE SENSORS

(75) Inventors: Miao-Cheng Liao, Yunlin (TW);
Jinn-Kwei Liang, Yongkang (TW);
Wen-Chieh Hsieh, Tainan (TW);
Shiu-Ko JangJian, Tainan (TW);
Hsiang Hsiang Ko, Sinying (TW);
Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 10 days.

(21) Appl. No.: 13/436,364

(22) Filed: Mar. 30, 2012

(65) Prior Publication Data

US 2013/0193540 A1     Aug. 1, 2013

Related U.S. Application Data

(60) Provisional application No. 61/593,038, filed on Jan. 31, 2012.

(51) Int. Cl.
*H01L 31/18* (2006.01)
*H01L 31/103* (2006.01)
*H01L 27/146* (2006.01)

(52) U.S. Cl.
CPC ........ *H01L 31/1804* (2013.01); *H01L 27/1462* (2013.01); *H01L 27/1464* (2013.01); *H01L 31/103* (2013.01); *Y02E 10/547* (2013.01); *Y02P 70/521* (2015.11)

(58) Field of Classification Search
CPC ... H01L 31/0232; H01L 31/18; H01L 31/062; H01L 31/103; H01L 31/1804; H01L 27/1464; H01L 27/1462; H01L 27/14621; H01L 27/14627; H01L 27/14685; H01L 27/1463
USPC ............... 257/233, 59, 72, 84, 222, 225, 226, 257/447, 228, E27.133, E31.053, 290–294, 257/443–445, 436, 439, 440, 458, 460–464, 257/E31.12, 432, E31.119, E31.127; 438/48, 65–66, 237, 57, 59, 60, 69–75, 438/144–145, 53, 797, 98
See application file for complete search history.

(56) References Cited

U.S. PATENT DOCUMENTS

| | | | |
|---|---|---|---|
| 5,795,833 A * | 8/1998 | Yu et al. | 438/763 |
| 6,852,565 B1 * | 2/2005 | Zhao | H01L 27/14632 438/200 |
| 7,800,684 B2 | 9/2010 | Tatani | |
| 7,863,076 B2 | 1/2011 | Hiyama | |
| 7,939,359 B2 | 5/2011 | Ohgishi | |
| 7,939,860 B2 | 5/2011 | Takimoto | |

(Continued)

FOREIGN PATENT DOCUMENTS

KR  20090037362 A   4/2009
KR  20100079247 A   7/2010

*Primary Examiner* — David Vu
*Assistant Examiner* — Mouloucoulaye Inoussa
(74) *Attorney, Agent, or Firm* — Slater Matsil, LLP (57) ABSTRACT

A method for reducing dark current in image sensors comprises providing a backside illuminated image sensor wafer, depositing a first passivation layer on a backside of the backside illuminated image sensor wafer, depositing a plasma enhanced passivation layer on the first passivation layer and depositing a second passivation layer on the plasma enhanced passivation layer.

20 Claims, 12 Drawing Sheets

(56) References Cited

U.S. PATENT DOCUMENTS

| | | |
|---|---|---|
| 7,968,365 B2 | 6/2011 | Hiyama et al. |
| 8,034,649 B2 | 10/2011 | Oshiyama et al. |
| 2002/0192913 A1* | 12/2002 | Chen et al. ............... 438/292 |
| 2004/0005729 A1* | 1/2004 | Abe et al. .................. 438/48 |
| 2006/0115230 A1* | 6/2006 | Komoguchi et al. ....... 385/146 |
| 2007/0210395 A1 | 9/2007 | Maruyama et al. |
| 2008/0121808 A1* | 5/2008 | Roizin et al. ........... 250/370.11 |
| 2008/0122424 A1* | 5/2008 | Zhang et al. .............. 324/72 |
| 2008/0224247 A1* | 9/2008 | Hsu et al. ................ 257/432 |
| 2009/0230496 A1 | 9/2009 | Takimoto |
| 2009/0294886 A1* | 12/2009 | Hsu et al. ................ 257/432 |
| 2010/0006969 A1* | 1/2010 | Park .............. H01L 27/14621 257/446 |
| 2010/0013039 A1* | 1/2010 | Qian et al. ............... 257/432 |
| 2010/0193669 A1 | 8/2010 | Yamaguchi et al. |
| 2011/0266645 A1 | 11/2011 | Chao |

* cited by examiner

APPARATUS AND METHOD FOR REDUCING DARK CURRENT IN IMAGE SENSORS

This application claims the benefit of U.S. Provisional Application No. 61/593,038, filed on Jan. 31, 2012, entitled "Film Structure for Improved CMOS Image Sensor Dark Current Performance," which application is hereby incorporated herein by reference.

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and all the necessary logics such as amplifiers, A/D converters and the like.

CMOS image sensors are pixelated metal oxide semiconductors. A CMOS image sensor typically comprises an array of light sensitive picture elements (pixels), each of which may include transistors (switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers such as dielectric layers and interconnect metal layers formed on top of the substrate, wherein the interconnect layers are used to couple the photo diode with peripheral circuitry. The side having additional layers of the CMOS image sensor is commonly referred to as a front side, while the side having the substrate is referred to as a backside. Depending on the light path difference, CMOS image sensors can be further divided into two major categories, namely front-side illuminated (FSI) image sensors and back-side illuminated (BSI) image sensors.

In a FSI image sensor, light from the subject scene is incident on the front side of the CMOS image sensor, passes through dielectric layers and interconnect layers, and finally falls on the photo diode. The additional layers (e.g., opaque and reflective metal layers) in the light path may limit the amount of light absorbed by the photo diode so as to reduce quantum efficiency. In contrast, there is no obstruction from additional layers (e.g., metal layers) in a BSI image sensor. Light is incident on the backside of the CMOS image sensor. As a result, light can strike the photo diode through a direct path. Such a direct path helps to increase the number of photons converted into electrons.

Photodiodes may generate electrons in response to the light incident on the backside of a CMOS image sensor. However, unwanted current may be generated in the absence of illumination. This unwanted current is known as the dark current. Excessive dark current may cause image degradation.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a backside illuminated image sensor. The embodiments of the disclosure may also be applied, however, to a variety of image sensors and semiconductor devices. Hereinafter, various embodiments will be explained in detail with reference to the accompanying drawings.

Figure 1:
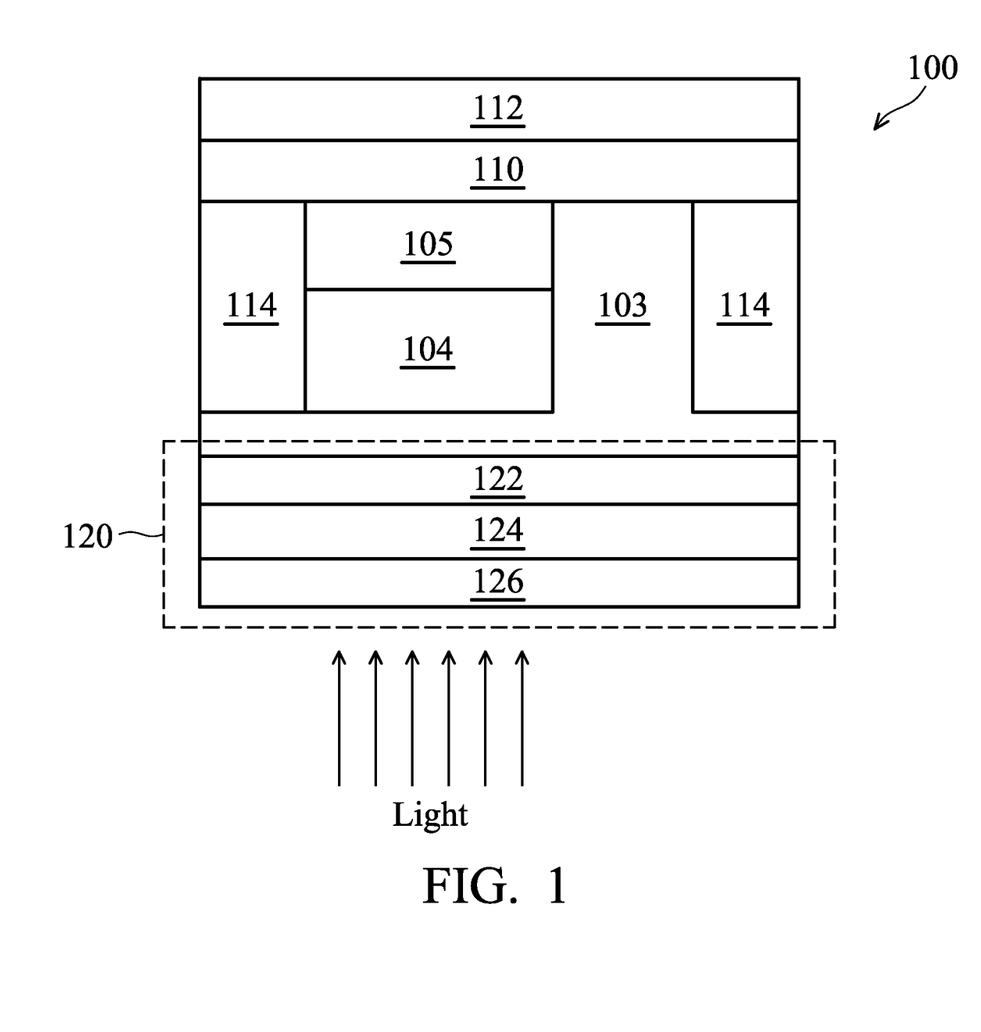
FIG. 1 illustrates a simplified cross sectional view of a backside illuminated image sensor in accordance with an embodiment.

FIG. 1 illustrates a simplified cross sectional view of a backside illuminated image sensor in accordance with an embodiment. The backside illuminated image sensor 100 is fabricated by CMOS process techniques known in the art. In particular, the backside illuminated image sensor 100 is formed in an epitaxial layer over a silicon substrate. According to the fabrication process of backside illuminated image sensors, the silicon substrate has been removed in a backside thinning process until the epitaxial layer is exposed. As shown in FIG. 1, a portion of epitaxial layer 103 remains. A p-type photo active region 105 and an n-type photo active region 104 are formed in the remaining epitaxial layer 103.

The photo active regions such as the p-type photo active region 105 and the n-type photo active region 104 may form a PN junction, which functions as a photodiode. In accordance with an embodiment, the photo active regions (e.g., the n-type photo active region 104 and the p-type photo active region 105) are formed in the epitaxial layer 103 grown from a p-type semiconductor substrate (not shown).

The backside illuminated image sensor 100 further comprises an isolation region 114 formed in the epitaxial layer 103. As shown in FIG. 1, the photodiode formed by the n-type photo active region 104 and the p-type photo active region 105 is enclosed by the isolation region 114. In particular, the isolation region 114 helps to prevent crosstalk and interference from adjacent pixels (not shown). In accordance with an embodiment, the isolation region 114 may be formed of P-type materials such as boron, $BF_2$ and the like. In addition, the isolation region 114 may comprise a shallow trench isolation (STI) structure (not shown). In accordance with an embodiment, the isolation region 114 has a doping depth in a range from about 0 um to about 2 um.

The backside illuminated image sensor 100 may comprise a plurality of additional layers such as dielectric layer 110 and interconnect metal layer 112 formed over the substrate. For simplicity, hereinafter the side having additional layers of the backside illuminated image sensor 100 is referred to as a front side, while the side having the substrate is referred to as a backside.

A dielectric layer 110 is typically formed over the front side of the substrate. It should be noted that other circuitry (not shown), such as transistors, capacitors, or the like, may also be formed in the epitaxial layer 103. In accordance with an embodiment, the dielectric layer 110 forms a planarized layer upon which other layers (e.g., metal interconnect layers) may be formed. In an embodiment, the dielectric layer 110 may be formed of low-K dielectric materials such as silicon oxide, borophosphosilicate glass (BPSG), phosphosilicate glass (PSG), fluorinated silicate glass (FSG), carbon-doped silicon oxide or the like. The dielectric layer 110 may be formed by any suitable techniques such as chemical vapor deposition (CVD) techniques or the like.

A metal interconnect layer 112 may be formed over the dielectric layer 110. The metal interconnect layer 112 can be patterned by plasma etching or a damascene process and may be formed of any conductive material suitable for a particular application. Materials that may be suitable include, for example, aluminum, copper, doped polysilicon or the like. Contacts and vias (not shown) may be formed to provide electrical connectivity between the metal interconnect layer and underlying circuitry.

The backside illuminated image sensor 100 may comprise a passivation layer 120 formed on the backside of the substrate. As shown in FIG. 1, the passivation layer 120 may comprise three layers. A first passivation layer 122 is formed on the backside of the substrate. The first passivation layer 122 is formed of dielectric materials such as silicon oxide materials, silicon nitride materials, silicon oxynitride materials and the like. The first passivation layer 122 may be formed using suitable techniques including but not limited to CVD, plasma enhanced CVD (PECVD), physical vapor deposition (PVD) and the like. In accordance with an embodiment, the first passivation layer 122 may be formed of dielectric materials such as silicon dioxide. The first passivation layer 122 is of a thickness in a range from about 80 Å to about 120 Å.

A composite passivation layer 124 is formed on the first passivation layer 122. The composite passivation layer 124 may further comprise a plurality of plasma enhanced dielectric layers (not shown but illustrated in FIG. 2). Each plasma enhanced dielectric layer is formed of dielectric materials such as silicon nitride and the like. The formation of a silicon nitride layer is similar to that of the first passivation layer 122. In addition, a plasma enhancement process is performed on each silicon nitride layer. The detailed fabrication process of the composite passivation layer 124 will be described in detail with respect to FIG. 2. The second passivation layer 126 is formed on the composite passivation layer 124. The second passivation layer 126 is similar to the first passivation layer 122, and hence is not discussed in further detail to avoid unnecessary repetition.

An advantageous feature of having the composite passivation layer 124 formed by plasma enhanced silicon nitride is that the plasma enhanced silicon nitride layers may comprise a high density of N-H content. Such a high density of N-H content helps to increase the level of negative charges. The negative charges from the plasma enhanced silicon nitride layers may reduce the positive charges trapped in the image sensor. As a result, the dark current performance of the backside illuminated image sensor 100 may be improved.

Figure 2:
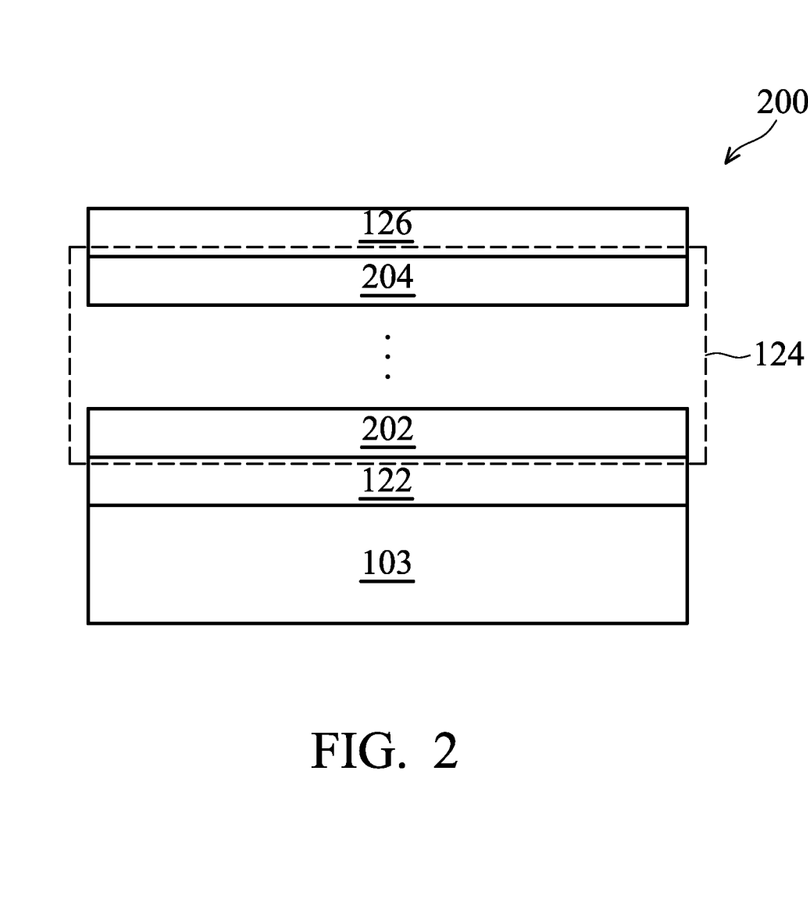
FIG. 2 illustrates a cross sectional view of a backside illuminated image sensor having a composite passivation layer in accordance with an embodiment.

FIG. 2 illustrates a cross sectional view of a backside illuminated image sensor having a composite passivation layer in accordance with an embodiment. The backside illuminated image sensor 200 may comprise a plurality of layers as shown in FIG. 1. For simplicity and clarity, only relevant portions of the backside illuminated image sensor 200 are included to show the inventive aspects of the composite passivation layer 124. As shown in FIG. 2, a first passivation layer 122 is formed on a backside of the substrate. The formation of the first passivation layer 122 has been described in detail with respect to FIG. 1, and hence is not discussed again to avoid repetition. The composite passivation layer 124 may comprise a plurality of plasma enhanced silicon nitride layers. In accordance with an embodiment, the total number of plasma enhanced silicon nitride layers is in a range from about 2 layers to about 20 layers.

A first plasma enhance silicon nitride layer 202 is formed on the first passivation layer 122. In particular, a silicon nitride layer is formed using suitable techniques including but not limiting to CVD and the like. After the silicon nitride layer is formed, high frequency plasma is performed on the silicon nitride layer. In addition, under the high frequency plasma, the silicon nitride layer reacts with Ammonia to increase the N-H content of the silicon nitride layer. As a result, the silicon nitride layer becomes a plasma enhanced silicon nitride layer.

In accordance with an embodiment, the power of the high frequency plasma is about 160 W. The time of the plasma treatment is about 60 seconds. Additional plasma enhanced silicon nitride layers (e.g., the plasma enhanced silicon nitride layer 204) may be formed on the first plasma enhanced silicon nitride layer 202.

In accordance with an embodiment, each plasma enhanced silicon nitride layer is of a thickness of about 500 Å. The total thickness of the composite passivation layer 124 depends on how many plasma enhanced silicon nitride layers are formed between the first passivation layer 122 and the second passivation layer 126. For example, when four plasma enhanced silicon nitride layers are formed between the first passivation layer 122 and the second passivation layer 126, the thickness of the composite passivation layer 124 is about 2000 Å.

It should be noted that while the description above is based upon a plasma enhanced silicon nitride layer, silicon nitride is merely an example, which should not unduly limit the scope of the claims. One of ordinary skill in the art would recognize many variations, alternatives, and modifications. For example, the composite passivation layer may be formed of silicon carbide, silicon nitride, combination thereof, and the like.

An advantageous feature of having the composite passivation layer shown in FIG. 2 is that plasma enhanced silicon nitride layers may be formed in an in-situ manner. Such an in-situ manner helps to reduce the cycle time of manufacturing backside illuminated image sensors. As a result, an effective solution for reducing the dark current performance of the backside illuminated image sensor 100 may be achieved by using a cost-effective and compatible manufacturing process.

Figure 3:
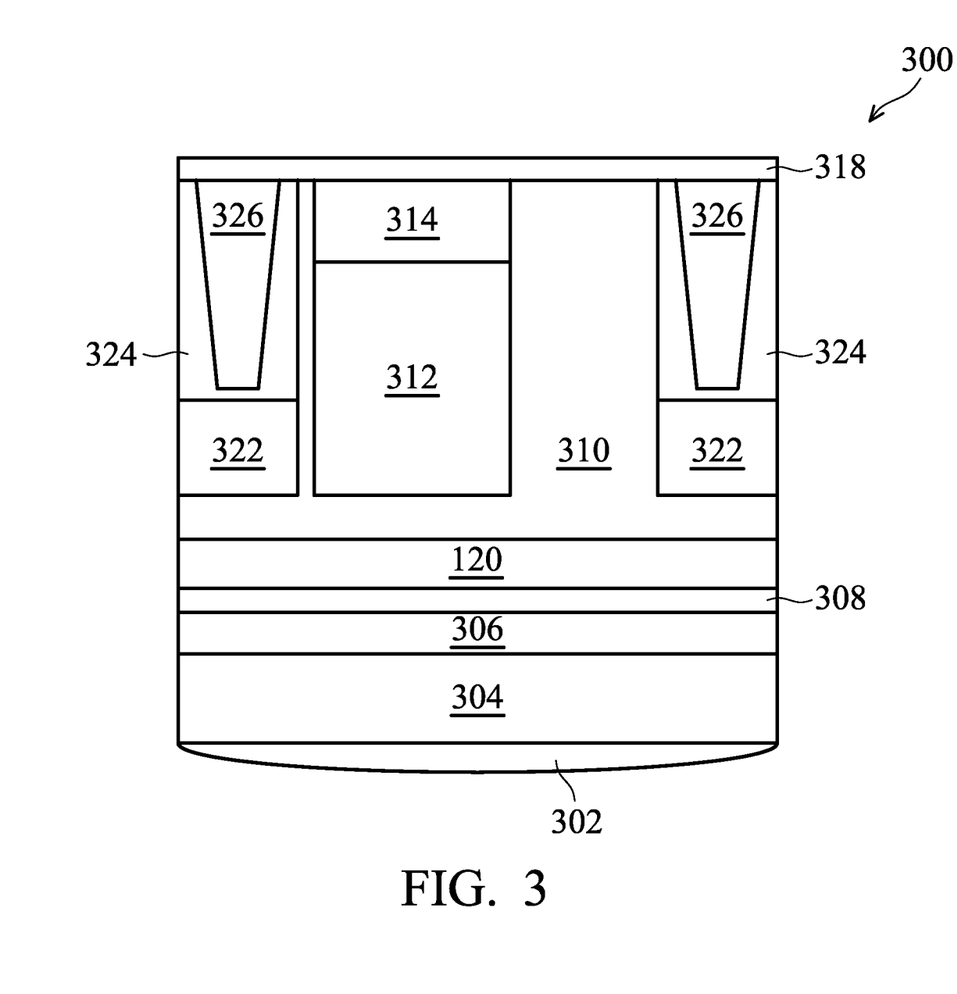
FIG. 3 illustrates a cross sectional view of a backside illuminated image sensor in accordance with another embodiment.

FIG. 3 illustrates a cross sectional view of a backside illuminated image sensor in accordance with another embodiment. In a backside illuminated image sensor, there may be a plurality of pixels, each of which is a photodiode formed in a silicon substrate. In accordance with an embodiment, the substrate 310 may be a p-type epitaxial layer grown from a p-type substrate (not shown). For simplicity, only one pixel is illustrated to show inventive aspects of various embodiments.

As shown in FIG. 3, the pixel 300 includes a photodiode formed by a p-type doped region 314 and an n-type doped region 312. The p-type doped region 314 may be formed by using an ion implantation process or a diffusion process from a front side of the wafer. In accordance with an embodiment, the p-type doped region 314 is doped with p-type doping materials such as boron. The doping concentration of the p-type doped region 314 is in a range from about $10^{16}/cm^3$ to about $10^{19}/cm^3$.

In accordance with an embodiment, the n-type doped region 312 may be formed by using an implantation process or a diffusion process similar to that of forming the p-type doped region 314. N-type doping materials such as phosphorus are doped into the epitaxial layer 310 to form the n-type doped region 312. In accordance with an embodiment, the front side ion implantation process or diffusion process may generate a doping concentration in a range from about $10^{16}/cm^3$ to about $10^{19}/cm^3$.

In order to avoid interference from adjacent pixels, an isolation region may be employed to prevent cross walk between adjacent pixels. The isolation region is formed by a STI structure 326, a cell p-well (CPW) region 324 and a deep p-well (DPW) region 322. The STI structure 326 may be formed by suitable fabrication techniques. For example, the STI structure 326 may be formed by patterning the epitaxial layer 310 by photolithography, etching the epitaxial layer 310 by plasma etching so as to form STI trenches and filling the STI trenches with dielectric materials to form the STI structure 326.

The CPW region 324 is formed of P-type materials such as boron and the like. The CPW region 324 has a doping concentration of about $10^{12}/cm^3$. The CPW region 324 has a doping depth in a range from about 0 um to about 1 um. The DFW region 322 has a doping concentration of about $5 \times 10^{11}/cm^3$. The DPW region 322 has a doping depth in a range from about 1 um to about 2 um. The pixel 300 may include other layers such as p+ ion layer 308, anti-reflection layer 306, color filter layer 304 and microlens layer 302, which will be discussed in detail below with respect to FIG. 4-12.

Figure 4:
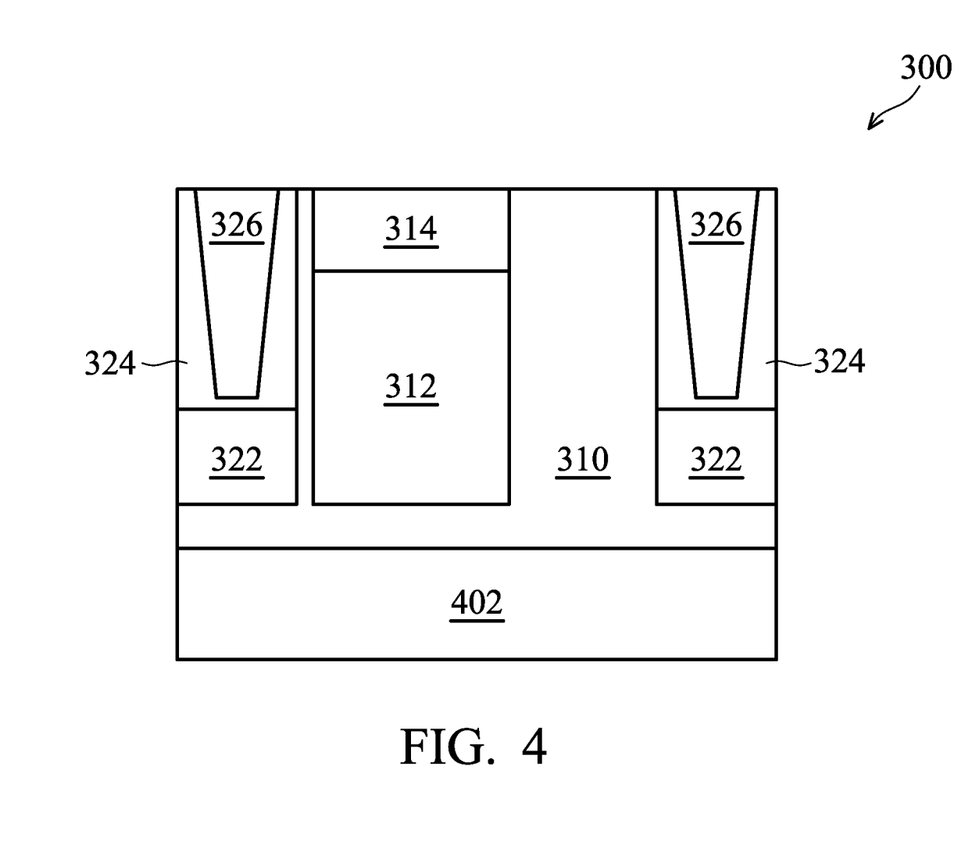
FIG. 4 is a cross sectional view of a backside illuminated image sensor wafer after a front side ion implantation process is performed on a substrate in accordance with an embodiment.

FIGS. 4-12 illustrates a method of fabricating a backside illuminated image sensor in accordance with an embodiment. FIG. 4 is a cross sectional view of a backside illuminated image sensor wafer after a front side ion implantation process is performed on a substrate in accordance with an embodiment. The backside illuminated image sensor wafer 300 comprises a substrate 402 having a first conductivity. In accordance with an embodiment, the substrate 402 is a p-type substrate. The substrate 402 may be formed of silicon, germanium, silicon germanium, graded silicon germanium, semiconductor-on-insulator, carbon, quartz, sapphire, glass, or the like, and may be multi-layered (e.g., strained layers).

A p-type epitaxial layer 310 is grown on the p-type substrate 402. In accordance with an embodiment, p-type impurity ions such as boron are implanted from the front side of the wafer into the p-type epitaxial layer 310 to form the p-type photo active region 314. In addition, n-type impurity ions such as phosphorous or arsenic are implanted from the front side of the wafer to form the n-type photo active region 312.

The backside illuminated image sensor wafer 300 may comprise a plurality of pixels (not shown), each of which comprises a PN junction formed by a p-type photo active region (e.g., photo active region 314) and an n-type photo active region (e.g., photo active region 312). In order to prevent crosstalk and interference between adjacent pixels, an isolation region including STI structure 326, CPW 324 and DFW 322 is employed to enclose the p-type photo active regions 314 and the n-type photo active region 312. The isolation region helps to prevent reflected light from adjacent pixels from reaching the photo active region 314 and the photo active region 312.

Figure 5:
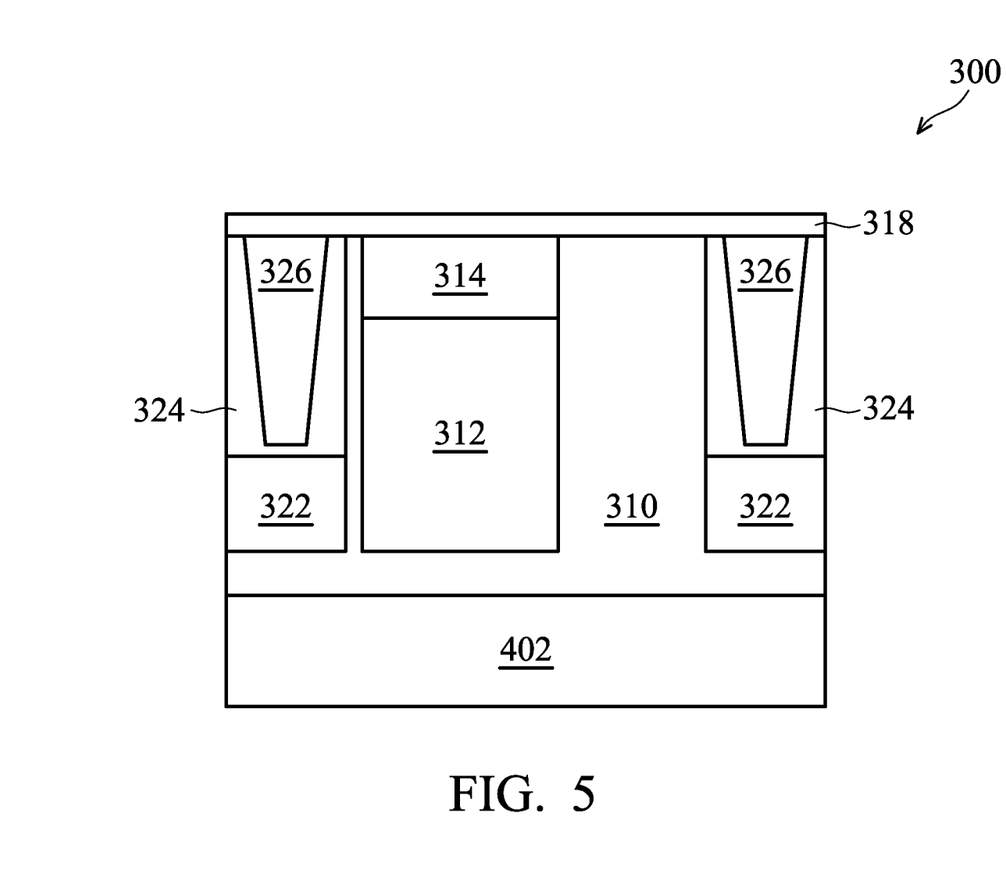
FIG. 5 illustrates a cross sectional view of the semiconductor device shown in FIG. 4 after additional front side layers have been formed over the photo active region in accordance with an embodiment.

FIG. 5 illustrates a cross sectional view of the semiconductor device shown in FIG. 4 after additional front side layers have been formed over the photo active region in accordance with an embodiment. A dielectric layer 318 is formed over the epitaxial layer 310. The dielectric layer 318 may be formed of silicon dioxide, silicon nitride and/or other suitable materials. The dielectric layer 318 may be formed using suitable techniques such as CVD, sputtering, spin-on and the like.

Figure 6:
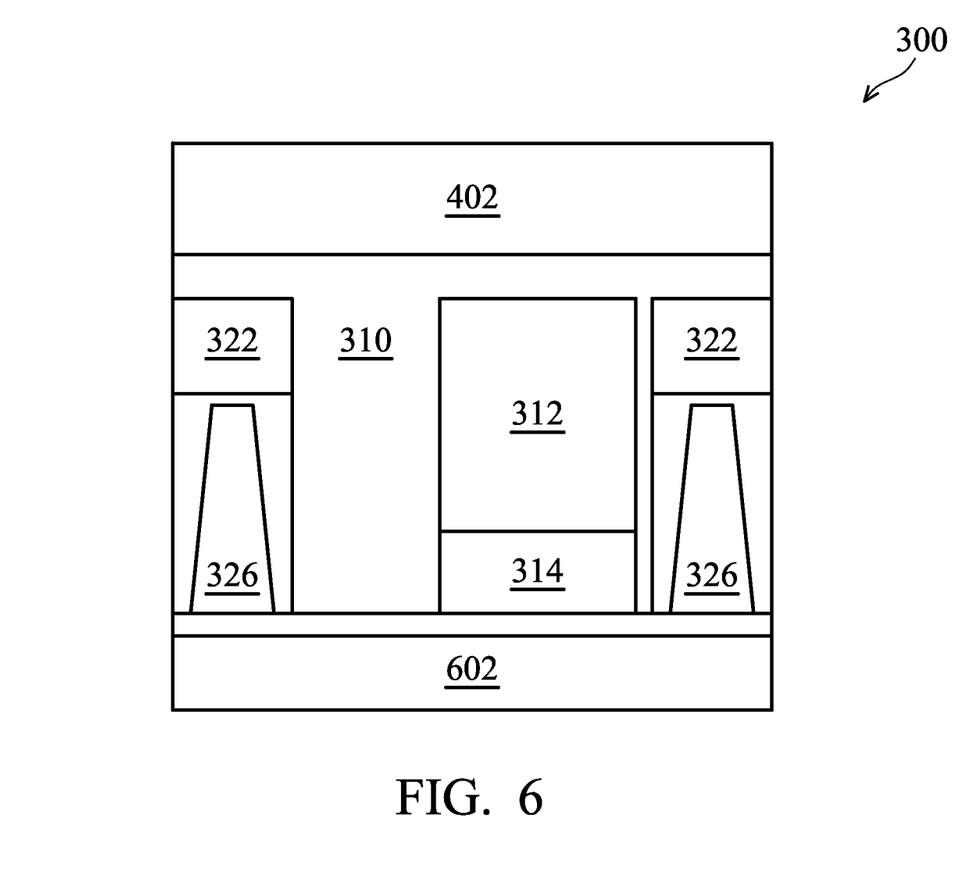
FIG. 6 is a cross sectional view of a backside illuminated image sensor wafer after the wafer is flipped and bonded on a carrier in accordance with an embodiment.

FIG. 6 is a cross sectional view of a backside illuminated image sensor wafer after the wafer is flipped and bonded on a carrier 602 in accordance with an embodiment. Once the dielectric layer 318 is formed, the backside illuminated image sensor wafer 300 is flipped and further bounded on a silicon or glass carrier 602. In particular, the front side of the backside illuminated image sensor wafer 300 faces up toward the carrier 602. Various bonding techniques may be employed to achieve bonding between the backside illuminated image sensor wafer 300 and the carrier 602. In accordance with an embodiment, suitable bonding techniques may include adhesive bonding, vacuum bonding, anodic bonding and the like. The carrier 602 may provide sufficient mechanical support to resist forces due to a grinding step of a thinning process. The thinning process will be described below with respect to FIG. 7.

Figure 7:
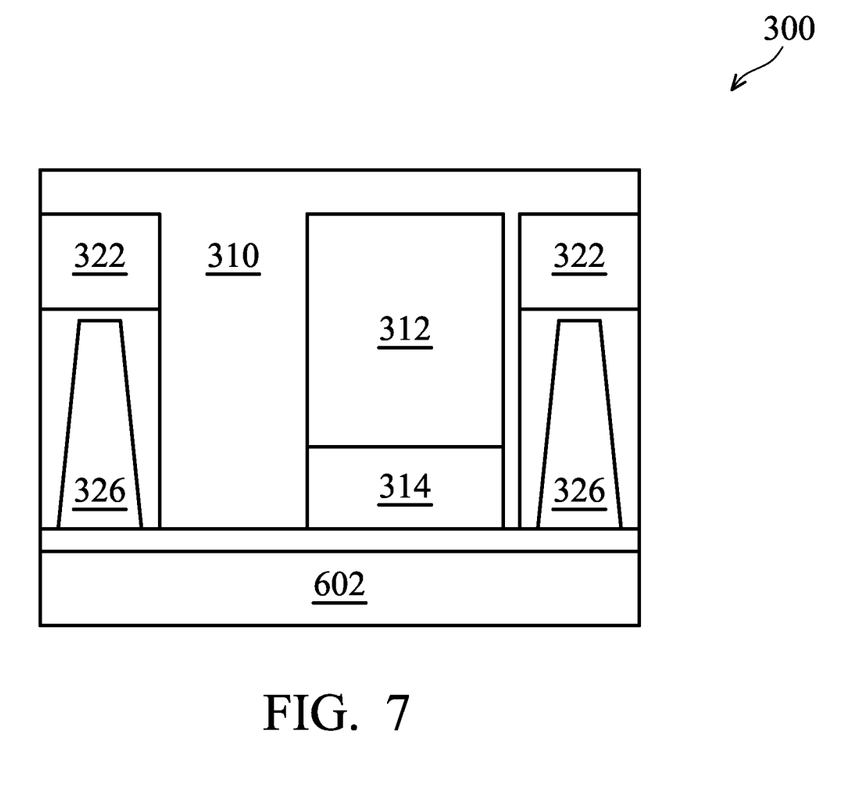
FIG. 7 is a cross sectional view of the backside illuminated image sensor wafer illustrated in FIG. 6 after a thinning process has been applied to the backside of the wafer in accordance with an embodiment.

FIG. 7 is a cross sectional view of the backside illuminated image sensor wafer illustrated in FIG. 6 after a thinning process has been applied to the backside of the wafer in accordance with an embodiment. According to the fabrication processes of backside illuminated image sensors, the substrate is thinned until the substrate 402 (illustrated in FIG. 6) is removed and the epitaxial layer 310 is exposed. More particularly the backside the substrate (e.g., the remaining of the p-type epitaxial layer 310) of the backside illuminated image sensor wafer 300 may be thinned to a thickness in a range from about 2 um to about 2.15 um. Such a thin substrate layer allows light to pass through the substrate (not shown) and hit photo diodes embedded in the substrate without being absorbed by the substrate.

The thinning process may be implemented by using suitable techniques such as grinding, polishing and/or chemical etching. In accordance with an embodiment, the thinning process may be implemented by using a chemical mechanical polishing (CMP) process. In a CMP process, a combination of etching materials and abrading materials are put into contact with the back side of the substrate and a grinding pad (not shown) is used to grind away the back side of the substrate until a desired thickness is achieved.

Figure 8:
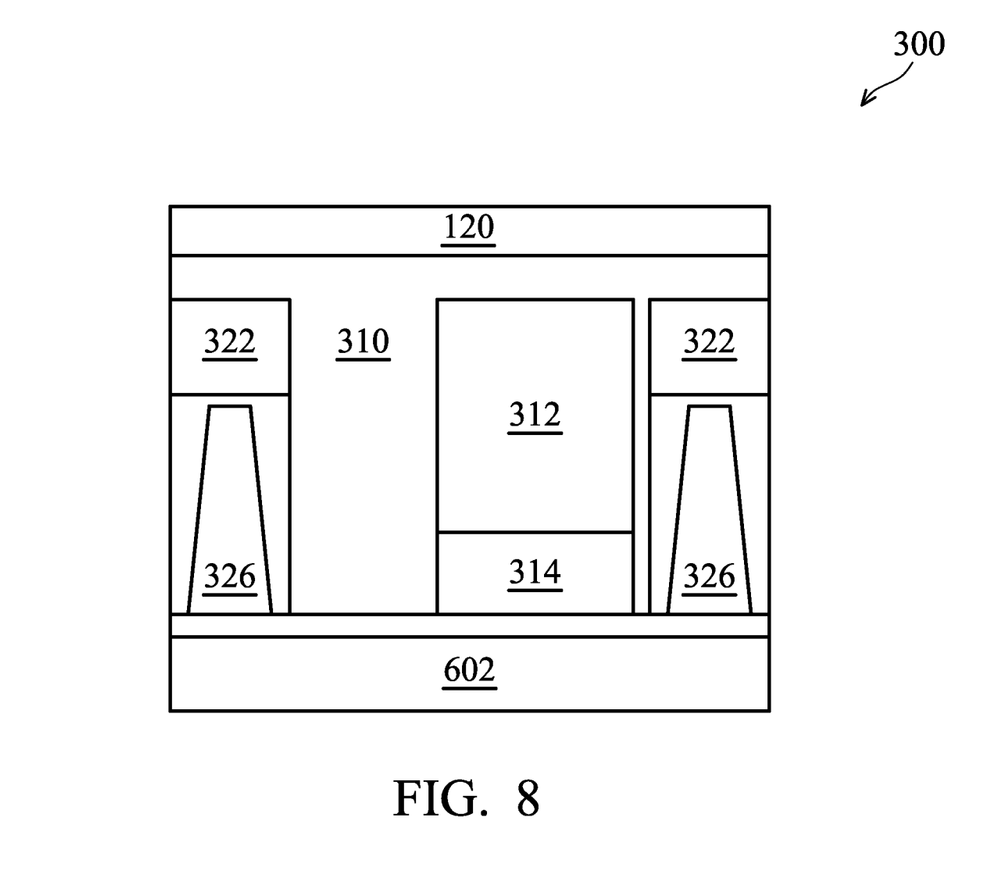
FIG. 8 is a cross sectional view of the backside illuminated image sensor wafer illustrated in FIG. 7 after a composite passivation layer has been applied in accordance with an embodiment.

FIG. 8 is a cross sectional view of the backside illuminated image sensor wafer illustrated in FIG. 7 after a composite passivation layer has been applied in accordance with an embodiment. Referring back to FIG. 2, the composite passivation layer 120 may include a plurality of plasma enhanced silicon nitride layers disposed between two silicon dioxide layers. The formation of plasma enhanced silicon nitride layers and silicon dioxide layers have been described in detail with respect to FIG. 2 and FIG. 1 respectively, and hence are not discussed again herein.

Figure 9:
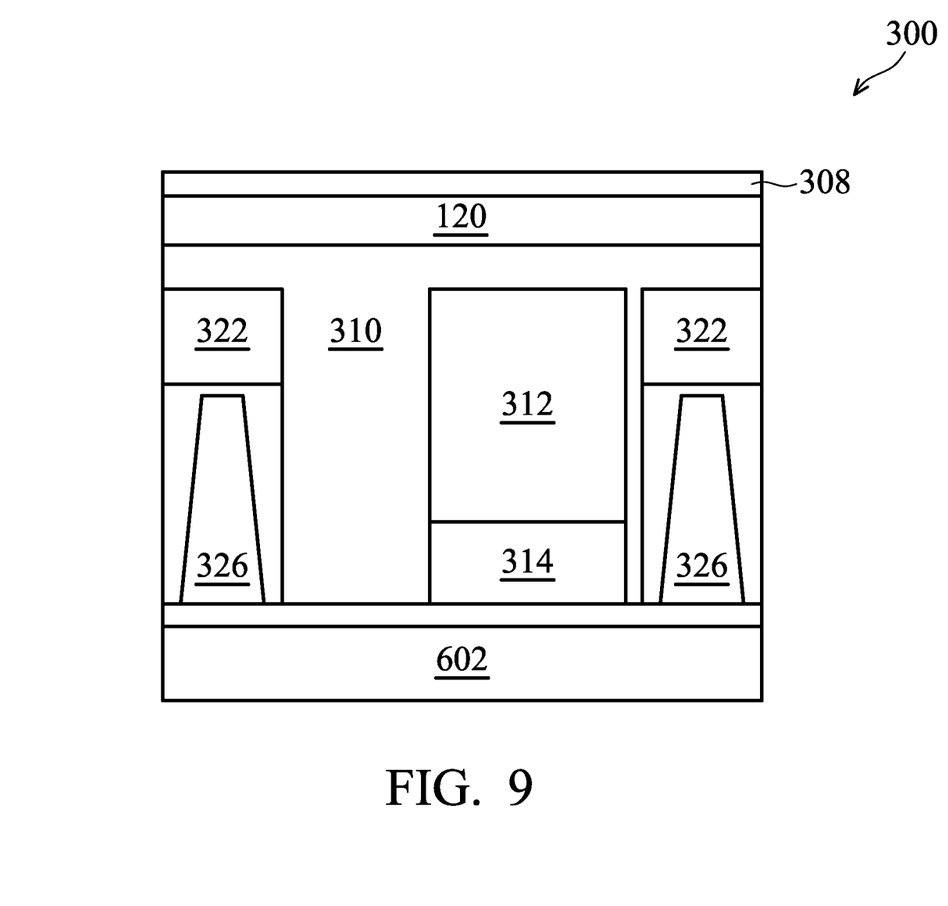
FIG. 9 is a cross sectional view of the backside illuminated image sensor wafer illustrated in FIG. 8 after a thin p+ ion layer has been applied to the backside of the wafer in accordance with an embodiment.

FIG. 9 is a cross sectional view of the backside illuminated image sensor wafer illustrated in FIG. 8 after a thin p+ ion layer has been applied to the backside of the wafer in accordance with an embodiment. Furthermore, the thin p+ ion layer 308 may be formed on the backside of the thinned substrate to increase the number of photons converted into electrons. The p+ ion implantation process may cause crystal defects. In order to repair crystal defects and activate the implanted p+ ions, a laser annealing process may be performed on the backside of the backside illuminated image sensor wafer 300.

Figure 10:
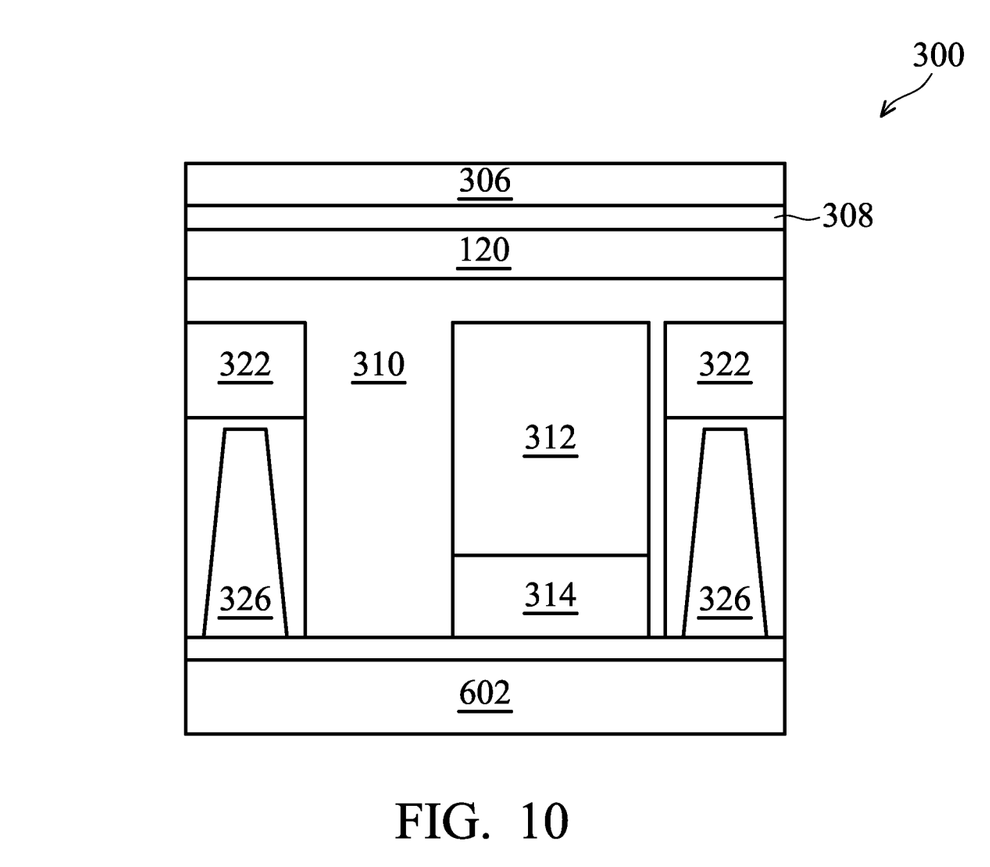
FIG. 10 is a cross sectional view of the backside illuminated image sensor wafer illustrated in FIG. 9 after an anti-reflection coating (ARC) layer has been applied to the backside of the wafer in accordance with an embodiment.

FIG. 10 is a cross sectional view of the backside illuminated image sensor wafer illustrated in FIG. 9 after an anti-reflection coating (ARC) layer has been applied to the backside of the wafer in accordance with an embodiment. The ARC layer 306 is formed over the p+ ion layer 308. The ARC layer 306 may be formed of a nitride material, an organic material, an oxide material and the like. The ARC layer 306 may be formed using suitable techniques such as CVD and the like.

Figure 11:
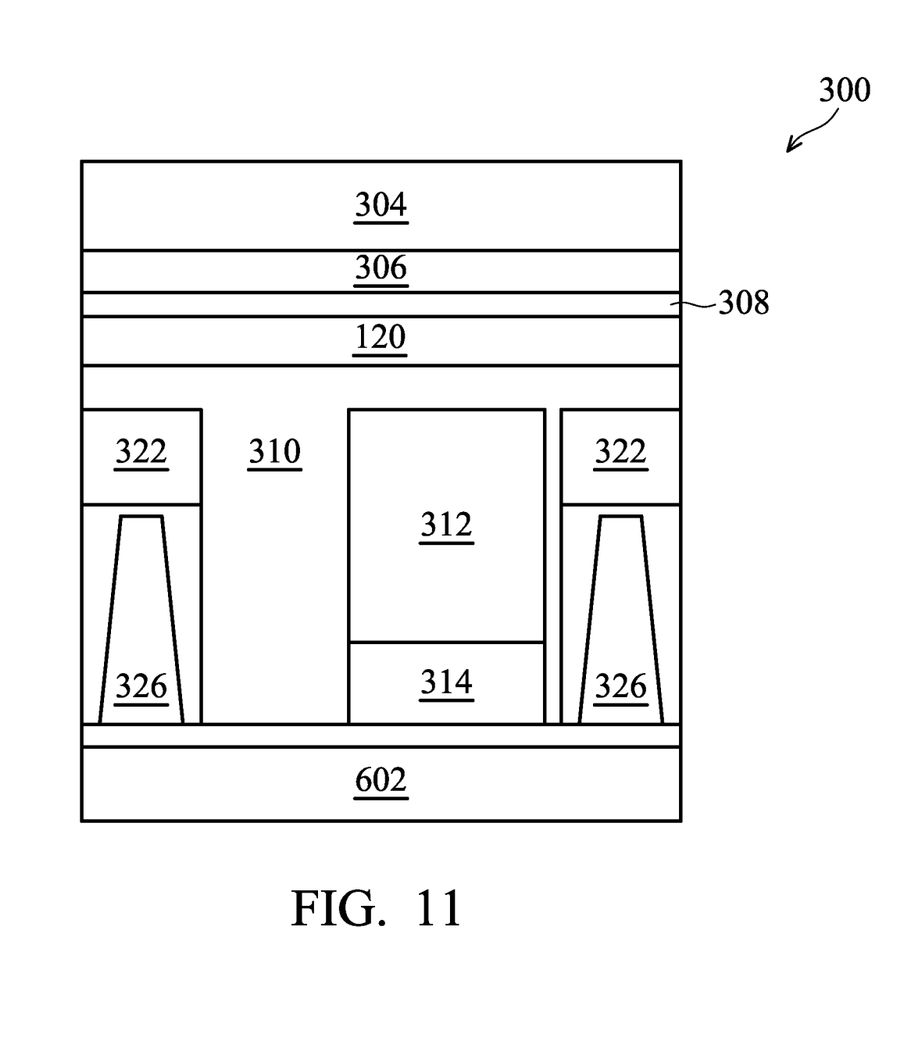
FIG. 11 is a cross sectional view of the backside illuminated image sensor wafer illustrated in FIG. 10 after a color filter layer has been applied in accordance with an embodiment.

FIG. 11 is a cross sectional view of the backside illuminated image sensor wafer illustrated in FIG. 10 after a color filter layer has been applied in accordance with an embodiment. The color filter layer 304 may be used to allow specific wavelengths of light to pass while reflecting other wavelengths, thereby allowing the image sensor to determine the color of the light being received by the photo active region (e.g., photo active regions 312 and 314). The color filter layer 304 may vary, such as a red, green, and blue filter. Other combinations, such as cyan, yellow, and magenta, may also be used. The number of different colors of the color filters 304 may also vary.

In accordance with an embodiment, the color filter layer 304 may comprise a pigmented or dyed material, such as an acrylic. For example, polymethyl-methacrylate (PMMA) or polyglycidylmethacrylate (PGMS) are suitable materials with which a pigment or dye may be added to form the color filter layer 304. Other materials, however, may be used. The color filter layer 304 may be formed by any suitable method known in the art.

Figure 12:
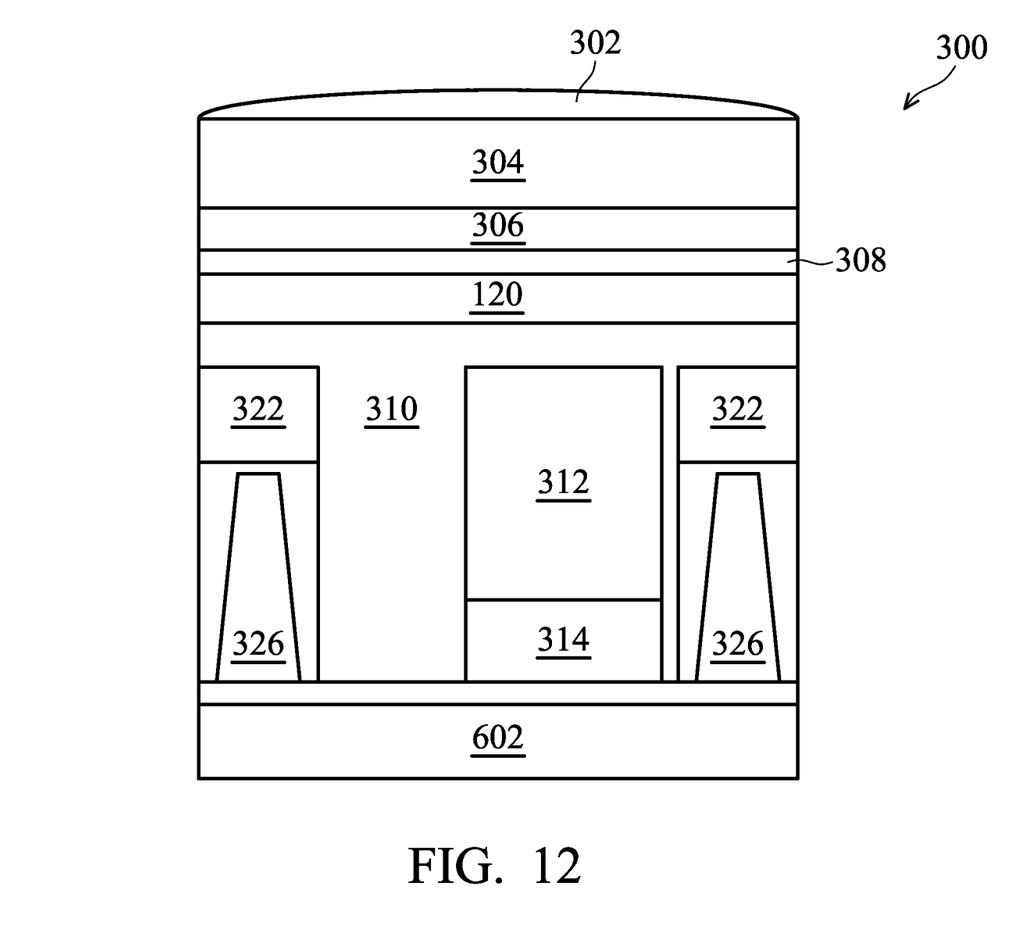
FIG. 12 is a cross sectional view of the backside illuminated image sensor wafer illustrated in FIG. 11 after a mircolens layer has been applied in accordance with an embodiment.

FIG. 12 is a cross sectional view of the backside illuminated image sensor wafer illustrated in FIG. 11 after a mircolens layer has been applied in accordance with an embodiment. The microlens layer 302 may be formed of any material that may be patterned and formed into lenses, such as a high transmittance, acrylic polymer. The microlens layer 302 is about 0.1 um to about 2.5 um in thickness. In accordance with an embodiment, the microlens layer 302 may be formed using a material in a liquid state and spin-on techniques known in the art. This method has been found to produce a substantially planar surface and a microlens layer 302 having a substantially uniform thickness, thereby providing greater uniformity in the microlenses. Other methods, such as deposition techniques like CVD, PVD or the like, may also be used.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   providing a backside illuminated image sensor wafer;
   forming a photodiode adjacent to a front side of the backside illuminated image sensor wafer;
   forming interconnect structures on the front side of the backside illuminated image sensor wafer;
   after forming the photodiode, depositing a first passivation layer on a backside of the backside illuminated image sensor wafer, wherein the backside of the backside illuminated image sensor wafer is disposed away from active devices;
   depositing a first plasma enhanced passivation layer on the first passivation layer;
   depositing a second plasma enhanced passivation layer on the first plasma enhanced passivation layer, wherein the second plasma enhanced passivation layer is in direct contact with the first plasma enhanced passivation layer; and
   depositing a second passivation layer on the second plasma enhanced passivation layer.

2. The method of claim 1, further comprising:
   growing an epitaxial layer in the backside illuminated image sensor wafer, wherein the photodiode is embedded in the epitaxial layer;

forming an isolation region in the epitaxial layer, wherein the isolation region encloses the photodiode; and forming a dielectric layer over the front side of the backside illuminated image sensor wafer.

3. The method of claim 2, wherein the photodiode comprises:

an n-type photo diode region; and a p-type photo diode region.

4. The method of claim 1, wherein the first passivation layer is formed of silicon dioxide.

5. The method of claim 1, wherein:

the first plasma enhanced passivation layer comprises silicon nitride; and the second plasma enhanced passivation layer comprises silicon nitride.

6. The method of claim 1, further comprising:

forming a p+ layer on the second passivation layer; and applying a laser annealing process to the p+ layer.

7. The method of claim 1, wherein:

a thickness of the first plasma enhanced passivation layer is in a range from about 1000 Å to about 10000 Å; and a thickness of the second plasma enhanced passivation layer is in a range from about 1000 Å to about 10000 Å.

8. The method of claim 1, further comprising:

depositing a silicon nitride layer on the first passivation layer; and performing a plasma treatment on the silicon nitride layer, wherein the silicon nitride layer reacts with Ammonia.

9. A method comprising:

growing an epitaxial layer on a silicon substrate;

forming a photo-sensitive region in the epitaxial layer;

forming an interconnect layer over a first side of the epitaxial layer, wherein the photo-sensitive region is adjacent to the interconnect layer;

after forming the photo-sensitive region, disposing a first passivation layer over a second side of the epitaxial layer, the second side being opposite of the first side, the second side of the epitaxial layer being disposed away from active devices;

disposing a first plasma enhanced passivation layer over the first passivation layer, the first plasma enhanced passivation layer being wider than the photo-sensitive region;

disposing a second plasma enhanced passivation layer over the first plasma enhanced passivation layer, wherein the second plasma enhanced passivation layer is in direct contact with the first plasma enhanced passivation layer; and disposing a second passivation layer over the second plasma enhanced passivation layer.

10. The method of claim 9, wherein:

the first passivation layer comprises silicon dioxide.

11. The method of claim 9, wherein:

the first plasma enhanced passivation layer comprises silicon nitride.

12. The method of claim 9, wherein:

the second passivation layer comprises silicon dioxide.

13. The method of claim 9, wherein:

the second plasma enhanced passivation layer comprises silicon nitride.

14. The method of claim 9, wherein:

the first passivation layer is of a first thickness of about 100 Å;

the first plasma enhanced passivation layer is of a second thickness of about 500 Å;

the second passivation layer is of a third thickness of about 100 Å; and the second plasma enhanced passivation layer is of a fourth thickness of about 500 Å.

15. A method comprising:

growing an epitaxial layer on a front side of a substrate, the substrate having a first conductivity;

implanting ions with a second conductivity in the epitaxial layer to form a first photo active region;

implanting ions with the first conductivity in the epitaxial layer to form a second photo active region;

thinning a backside of the substrate until a backside of the epitaxial layer is exposed;

after thinning the backside of the substrate, disposing a first passivation layer over the backside of the epitaxial layer, wherein interconnect structures are on a front side of the epitaxial layer, and wherein the backside of the epitaxial layer is disposed away from active devices;

disposing a first plasma enhanced passivation layer over the first passivation layer;

disposing a second plasma enhanced passivation layer over the first plasma enhanced passivation layer, wherein the second plasma enhanced passivation layer is in direct contact with the first plasma enhanced passivation layer; and disposing a second passivation layer over the second plasma enhanced passivation layer.

16. The method of claim 15, wherein:

the first conductivity is p-type; and the second conductivity is n-type.

17. The method of claim 15, further comprising:

forming a p+ layer over the second passivation layers; and applying a laser annealing process to the p+ layer.

18. The method of claim 17, further comprising:

depositing an anti-reflection coating layer on the p+ layer;

forming a color filter layer on the anti-reflection coating layer; and forming a microlens layer on the color filter layer.

19. The method of claim 15, wherein:

the first plasma enhanced passivation layer and the second plasma enhanced passivation layer comprise silicon nitride.

20. The method of claim 15, wherein the first passivation layer is formed of silicon dioxide; and the second passivation layer is formed of silicon dioxide.

* * * * *